United States Patent Office 3,778,354

Patented Dec. 11, 1973

3,778,354

USE OF COBALT IN A NONORGANIC COPPER SULFATE ELECTROPLATING BATH

Emil Toledo, Natick, Mass., assignor to the United States of America as represented by the Secretary of the Navy No Drawing. Filed Sept. 13, 1972, Ser. No. 288,611
Int. Cl. C23b 5/34
U.S. Cl. 204—44 12 Claims

ABSTRACT OF THE DISCLOSURE

An inorganic copper sulfate bath for electroplating copper is provided which contains minor quantities of cobalt.

BACKGROUND OF THE INVENTION

This invention generally relates to a copper sulfate bath used to electrolytically plate copper onto various substrates and more particularly to an inorganic copper sulfate bath which also contains some cobalt.

Adhesive failure of electroplated solder on certain types of electroplated copper has recently been encountered by the printed circuit industry. This has been shown to occur particularly after the circuit board is exposed to elevated temperatures incurred in such processes as lamination, solder reflow, and thermal aging. Typical failures are exhibited by lack of adhesion of the solder when pressure sensitive adhesive tape is applied to the circuitry and pulled. A second type of failure has been the separation of solder joints from the copper pads with little or no externally applied stress.

Work done in researching the solder adhesion failure mechanism associates the failures with copper that is electroplated from baths containing organic leveling agents. These leveling agents are codeposited to some extent with the copper and are responsible for causing weak interfaces with the electroplated solder. A higher degree of solder adhesion failure has been noticed in baths in which these organic leveling agents and their electrolysis breakdown products have accumulated. Thus, research has been conducted to find copper sulfate plating solutions which yield good quality products but which do not contain organic leveling agents which lead to solder adhesion failure.

SUMMARY OF THE INVENTION

Accordingly, one object of this invention is to provide a copper sulfate bath from which copper can be electroplated.

Another object of this invention is to provide a copper sulfate bath which does not include organic agents.

Still another object of this invention is to provide a copper sulfate bath from which copper can be electroplated which has a relatively low number of solder adhesion failures.

A still further object of this invention is to provide an additive for copper sulfate baths which has the effect of extending the bright plating range of these baths without adding organic materials to the bath.

A still further object of this invention is to provide a method for improving the leveling and brightness of a copper sulfate bath which has deteriorated from use.

These and other objects of this invention are accomplished by providing a copper sulfate bath which contains small quantities of cobalt ion.

DESCRIPTION OF THE PREFERRED EMBODIMENT

The use of copper sulfate baths to electroplate copper onto various substrates is well known in the prior art. Typically, one plates copper onto a substrate and then etches some copper off in order to obtain an article which finds use in a variety of electrical apparatus.

The typical copper sulfate bath, such as these commonly used in industry contain various organic additives. However, it has been found that if small quantities of cobalt ion are added to these copper sulfate baths all organic agents can be eliminated so that the detrimental features of having organic agents in the bath are overcome. The cobalt ion in the solution is plated along with the copper. Additionally, it has been found that the inclusion of these small quantities of cobalt in the copper retards and prevents diffusion, which ordinarily weakens joints, between the copper and other metals at interfaces between these materials. Thus for example the presence of the cobalt in copper prevents the formations of intermetallic compounds in soldered products at the copper-tin interface. Similarly, the presence of small quantities of cobalt in copper retards and prevents diffusion between copper and many other metals when there is such an interface. Among the metals which have their diffusion retarded at an interface with copper-cobalt are low melting point metals such as Sn and Cd, heavy metals such as Mo, Pb and W, light metals such as Al, transition metals such as Ni, Fe and Co as well as alloys of all these metals and mixtures thereof. The copper-cobalt diffusion barrier is preferably used on Sn, Co, Ni, Fe, alloys thereof and mixtures thereof. The quantity of Co needed in the copper varies from about 0.05 weight percent to about 2 weight percent with the preferred range being about 0.1 weight percent to about 0.5 weight percent.

The cobalt ion should be present in the plating bath in a quantity sufficient to insure that about 0.05–2 weight percent of cobalt plates out with the copper. Since the copper plates out at a rate between about 4 and 8 times as fast as the cobalt it is necessary to adjust the cobalt ion concentration accordingly. Thus, for example, if a cobalt content of 1 weight percent is desired it will be necessary to have 4 to 8 moles of cobalt ion for each 100 moles of copper ion. In this way about 1% cobalt will be plated out with the copper.

The rate of plating of cobalt is in large part determined by the inorganic compound that is used to introduce the cobalt ion into the plating bath. If simple cobalt ions such as cobalt nitrate or cobalt sulfate are used the copper deposition rate will be in the neighborhood of 8 times faster. If complex cobalt salts such as cobalt ammonium sulfate and cobalt sulfamate are used the copper will plate out only about 4 times as fast. Thus it is preferred to use cobalt ammonium sulfate and cobalt sulfamate as the inorganic cobalt salt in the plating bath.

In summation if a cobalt content of about 0.05 weight percent is desired and complex cobalt salts are used so that copper plates out 4 times as fast then the cobalt concentration should be about 0.2 part by weight for each 100 parts by weight of copper. If a cobalt content of about 2 weight percent is desired and the simple salts are used then the cobalt content should be about 16 parts by weight for each 100 parts by weight copper. Thus the cobalt ion concentration should be about 0.2–16 parts by weight per 100 parts by weight copper. In the preferred range of 0.1–0.5 weight percent cobalt in copper the ratio of cobalt ion to copper is about 0.4–4 parts by weight per 100 parts by weight of copper.

EXAMPLE

A typical copper sulfate bath which has been used to electroplate copper has the following composition:

| | | |
|---|---|---|
| Temperature | ° F. | 100±10 |
| Anode to cathode ratio | | 1:1–2:1 |
| Copper, metal | g./l. | 60±5 |
| Sulfuric acid | g./l. | 100±10 |
| Current density | a.s.f. | 20–60 |
| Specific gravity | ° Bé. | 21–25 |

As will be recognized by those skilled in the art, the various constituents of the sulfate bath may vary over a fairly wide range. Since the use and compositions of sulfate baths are well known in the art further details will now not be given.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. In an aqueous acidic inoragnic copper sulfate electroplating bath wherein essentially all of the metal cations present are copper and cobalt cations the improvement comprising:

including about 0.2–16 parts by weight of cobalt ion per each 100 parts by weight of copper.

2. The bath of claim 1 wherein said cobalt ion constitutes about 0.4–4 parts by weight per 100 parts by weight of copper.

3. The bath of claim 2 wherein said cobalt ion is present as an inorganic cobalt salt selected from the group consisting of cobalt ammonium sulfate, cobalt sulfamate, cobalt nitrate, cobalt sulfate and mixtures thereof.

4. The bath of claim 3 wherein said cobalt salt is cobalt ammonium sulfate.

5. The bath of claim 1 wherein said cobalt ion is present as an inorganic cobalt salt selected from the group consisting of cobalt ammonium sulfate, cobalt sulfamate, cobalt nitrate, cobalt sulfate and mixtures thereof.

6. The bath of claim 5 wherein said cobalt salt is cobalt ammonium sulfate.

7. In the method of electroplating copper from an aqueous acidic inorganic copper sulfate bath wherein essentially all of the metal cations present are copper and cobalt cations the improvement comprising:

including about 0.2–16 parts by weight of cobalt ion per each 100 parts by weight of copper.

8. The method of claim 7 wherein said cobalt ion constitutes 0.4–4 parts by weight of the bath per each 100 parts by weight of copper.

9. The method of claim 8 wherein said cobalt ion is present as an inorganic cobalt salt selected from the group consisting of cobalt ammonium sulfate, cobalt sulfamate, cobalt sulfate, cobalt nitrate and mixtures thereof.

10. The method of claim 11 wherein said cobalt salt is cobalt ammonium sulfate.

11. The method of claim 7 wherein said cobalt ion is present as an inorganic cobalt salt selected from the group consisting of cobalt ammonium sulfate, cobalt sulfamate, cobalt sulfate, cobalt nitrate and mixtures thereof.

12. The method of claim 9 wherein said cobalt salt is cobalt ammonium sulfate.

References Cited

UNITED STATES PATENTS 3,616,331 10/1971 O'Neill et al. 204—108

FOREIGN PATENTS 633,780 12/1949 Great Britain 204—108

OTHER REFERENCES

Frederick A. Lowenheim: "Modern Electroplating," p. 143 (1968).

Colin G. Fink et al.: Trans. Electrochem. Soc., vol. 85, pp. 119–122 (1944).

GERALD L. KAPLAN, Primary Examiner